United States Patent
Ban (10) Patent No.: US 9,077,382 B2
(45) Date of Patent: Jul. 7, 2015

(54) REED-SOLOMON DECODER AND RECEPTION APPARATUS

(75) Inventor: Koichiro Ban, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 162 days.

(21) Appl. No.: 13/409,691

(22) Filed: Mar. 1, 2012

(65) Prior Publication Data

US 2012/0254704 A1     Oct. 4, 2012

(30) Foreign Application Priority Data

Mar. 28, 2011 (JP) ................. 2011-070699

(51) Int. Cl.
*H03M 13/00*     (2006.01)
*H03M 13/15*     (2006.01)

(52) U.S. Cl.
CPC ........ *H03M 13/1515* (2013.01); *H03M 13/155* (2013.01); *H03M 13/1555* (2013.01); *H03M 13/618* (2013.01)

(58) Field of Classification Search
CPC ... H03M 13/151; H03M 13/15; H03M 13/29; H04L 1/0057; G11B 20/1833
USPC .......................... 714/784, 785, 781, 756, 762
See application file for complete search history.

(56) References Cited

U.S. PATENT DOCUMENTS

| | | | | |
|---|---|---|---|---|
| 5,490,101 A * | 2/1996 | Lee | ................................. | 708/625 |
| 5,699,368 A * | 12/1997 | Sakai et al. | ................... | 714/757 |
| 5,768,296 A * | 6/1998 | Langer et al. | ................. | 714/784 |
| 5,887,005 A * | 3/1999 | Sharma | ......................... | 714/784 |
| 6,031,875 A * | 2/2000 | Im | ................................... | 375/262 |
| 6,122,766 A * | 9/2000 | Fukuoka et al. | .............. | 714/784 |
| 6,647,529 B2 * | 11/2003 | Hirofuji et al. | ................ | 714/784 |
| 6,928,601 B2 * | 8/2005 | Katayama et al. | ............ | 714/781 |
| 7,613,988 B1 * | 11/2009 | Wu et al. | ....................... | 714/784 |
| 7,716,562 B1 * | 5/2010 | Wu et al. | ....................... | 714/784 |
| 7,788,570 B1 * | 8/2010 | Feng | ............................. | 714/784 |
| 7,978,972 B2 * | 7/2011 | Ohira et al. | ..................... | 398/25 |

(Continued)

FOREIGN PATENT DOCUMENTS

| | | | |
|---|---|---|---|
| HK | 2008-148245 A | | 6/2008 |
| JP | 63-86924 A | | 4/1988 |

(Continued)

OTHER PUBLICATIONS

Japanese Office Action dated Jan. 29, 2013 (and English translation thereof) in counterpart Japanese Application No. 2011-070699.

*Primary Examiner* — Albert Decady
*Assistant Examiner* — Osman Alshack
(74) *Attorney, Agent, or Firm* — Holtz, Holtz, Goodman & Chick PC (57) ABSTRACT

According to one embodiment, a Reed-Solomon decoder comprises an analyzer and a calculator. The analyzer analyzes a data frame and calculates a size of a last code word located at an end of a data portion, using information included in a header portion. The calculator calculates correction coefficients, using the size of the last code word, for correcting coefficients of an error locator polynomial and coefficients of an error value polynomial for the last code word in accordance with a difference between a base size of Reed-Solomon code words and the size of the last code word, before error detection for a code word located immediately before the last code word in the data portion begins.

7 Claims, 6 Drawing Sheets

(56) References Cited

U.S. PATENT DOCUMENTS

| | | | |
|---|---|---|---|
| 2003/0009723 A1* | 1/2003 | Chien | 714/784 |
| 2005/0237920 A1* | 10/2005 | Howard et al. | 370/208 |
| 2007/0204207 A1* | 8/2007 | Ma et al. | 714/785 |
| 2008/0163021 A1* | 7/2008 | Ohira et al. | 714/746 |
| 2013/0111304 A1* | 5/2013 | Lin et al. | 714/785 |

FOREIGN PATENT DOCUMENTS

| | | |
|---|---|---|
| JP | 63-86927 A | 4/1988 |
| JP | 11-191758 A | 7/1999 |
| JP | 2004-120419 A | 4/2004 |
| JP | 2005-218098 A | 8/2005 |
| JP | 2005-303495 A | 10/2005 |

* cited by examiner

REED-SOLOMON DECODER AND RECEPTION APPARATUS

CROSS-REFERENCE TO RELATED APPLICATIONS

This application is based upon and claims the benefit of priority from prior Japanese Patent Application No. 2011-070699, filed Mar. 28, 2011, the entire contents of which are incorporated herein by reference.

FIELD

Embodiments described herein relate generally to decoding Reed-Solomon codes.

BACKGROUND

Reed-Solomon codes are used for error correction in, for example, terrestrial wave digital broadcasting system. With Reed-Solomon codes, a series of bits can be treated as one symbol. With Reed-Solomon codes, error correction can be performed symbol by symbol. A base size (symbol length) of a Reed-Solomon code word is defined by the number of elements included in division algebra that defines symbols. When implemented, a code word which is shorter than the base size (hereinafter, called a "shortened code word") is sometimes used.

In order to increase the rate of decoding a shortened code word (in other words, to reduce decoding latency), correction coefficients are used in accordance with the size of a shortened code word to be decoded. On the other hand, in the decoding process, it is necessary to secure hardware (e.g., a dedicated circuitry) and a period for calculating such correction coefficients.

DETAILED DESCRIPTION

In the following, the embodiments will be explained with reference to the drawings.

In general, according to one embodiment, a Reed-Solomon decoder comprises an analyzer and a coefficient calculator. The analyzer analyzes a data frame including a data portion including at least two Reed-Solomon code words and a header portion including information indicating a size of the data portion and calculates the size of the last code word located at an end of the data portion, using the information included in the header portion. The coefficient calculator calculates correction coefficients, using the size of the last code word, for correcting coefficients of an error locator polynomial and coefficients of an error value polynomial for the last code word in accordance with a difference between the base size of the Reed-Solomon code words and the size of the last code word, before error detection for a code word located immediately before the last code word in the data portion begins.

In the drawings, the same constituent elements are denoted by the same respective reference numbers. Redundant explanation will be avoided. Also, if there is more than one element denoted by a reference number XXX, they are distinguished by, for example, XXX-A, XXX-B, or XXX refers to all of the elements comprehensively.

(First Embodiment)

Figure 1:
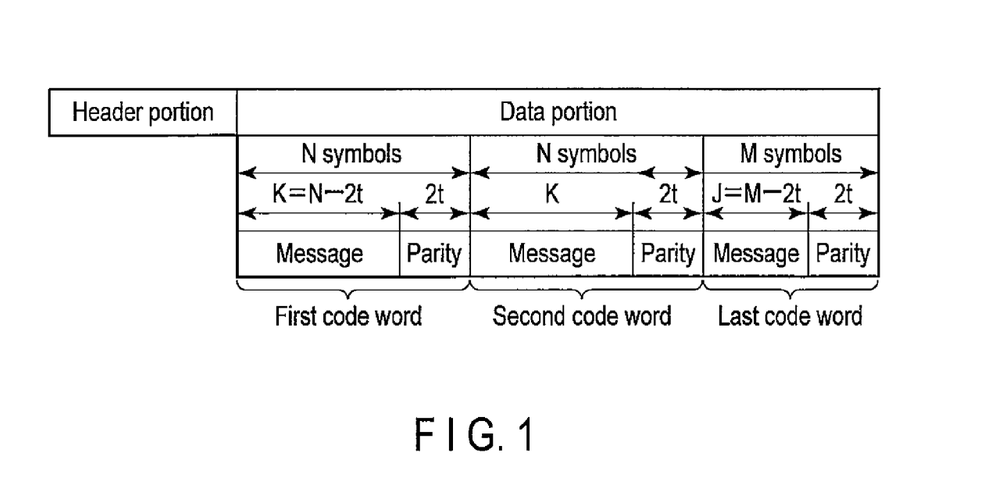
FIG. 1 is a diagram showing an example of a data frame including at least one Reed-Solomon code word.

The Reed-Solomon decoder according to the first embodiment performs error correction decoding for a Reed-Solomon code word included in a data frame shown in FIG. 1, for example, to reconstruct a message (sometimes called as data).

The data frame shown in FIG. 1 includes a header portion and a data portion. The header portion includes various information regarding the data frame or the data portion. For example, the header portion includes information indicating the size of the data frame or the data portion.

The data portion includes at least one code word. More specifically, in the example of FIG. 1, the message is encoded using a Reed-Solomon code (N, K, t) defined by a Galois Field (GF) ($2^q$). In other words, a code word is a Reed-Solomon code word consisting of a message consisting at most K symbols and a parity consisting of 2t symbols. The Reed-Solomon code word consists of at most N (=K+2t) symbols. Each symbol is expressed with q bits and has $2^q$ possible values. The addition and multiplication of symbols in the following explanation should be regarded as addition and multiplication on the GF ($2^q$).

The base size of the Reed-Solomon code word is ($2^q-1$) symbol. Suppose if N is less than ($2^q-1$) (in other words, if N-symbol code word is a shortened code word), ($2^q-1-N$) zero symbol(s) can be padded to the beginning of the shortened code word. According to such an operation, the shortened code word can be treated mathematically identically as a code word of the base size. Since there is no need to transmit the padded zero symbol(s), it is not included in a data frame.

In the example of FIG. 1, a message is divided in a unit of K symbols to be encoded. Thus, all the code words except for the last code word located at the end of the data portion has a fixed size (N symbols). On the other hand, the last code word has a variable size (M (=J+2t) symbols) which is dependent on the size of a message, because J symbols (J is an integer number, not less than 1 and not greater than K) which is the remainder of the division of the message by a unit of K symbols is coded. The last code word can be treated mathematically identically with the code word of the base size through padding ($2^q-1-M$) zero symbols at the beginning of the last code word. If a typical data frame, such as one illustrated in FIG. 1, is assumed, there are at maximum two sizes only for a code word in one data frame.

Figure 2:
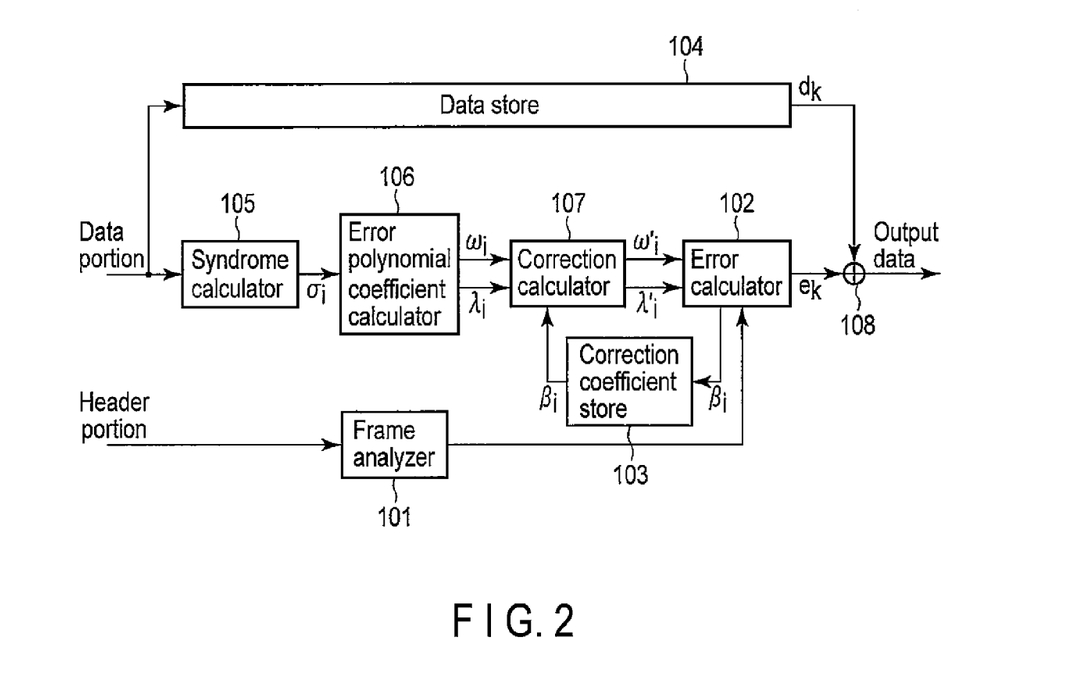
FIG. 2 is a block diagram showing the Reed-Solomon decoder according to the first embodiment.

As illustrated in FIG. 2, the Reed-Solomon decoder according to the present embodiment comprises a frame analyzer 101, an error calculator 102, a correction coefficient store 103, a data store 104, a syndrome calculator 105, an error polynomial coefficient calculator 106, a correction calculator 107, and a Galois field adder 108. The Reed-Solomon decoder of FIG. 2 inputs a data frame, for example, identical or similar to the data frame illustrated in FIG. 1. Specifically, the frame analyzer 101 inputs a header portion of the data frame (information indicating the size of a data frame or a data portion), and the syndrome calculator 105 inputs a data portion of the data frame. The data portion of the data frame is stored in the data store 104. The Reed-Solomon decoder in FIG. 2 detects an error occurred in a code word by performing, for example, a Chien search and the Forney algorithm, and corrects the error to obtain a reconstructed message (output data).

The data frame analyzer 101 inputs a header portion of the data frame, for example, and analyzes the information indicating the size of the data frame or the data portion. The frame analyzer 101 calculates the size of the last code word of the data frame based on such information. The size of the last code word is not necessarily defined by the size of whole code word (size M), and it may be defined by size J, which is whole code word except for parity symbols.

The frame analyzer 101 may analyze or calculate the number of code words W included in the data frame so that the Reed-Solomon decoder of FIG. 2 can determine whether a code word to be processed is the last code word or not. For example, the Reed-Solomon decoder of FIG. 2 determines the code word to be processed is not the last code word if the number of already processed code words is less than (W−1), and if the number of already processed code words reaches (W−1), the decoder determines that the code word to be processed is the last code word.

The frame analyzer 101 obtains a parameter S through the above-described analysis. The parameter S is valid as long as it determines the size of the last code word uniquely. In other words, the parameter S may be the total number of symbols included in the data portion (i.e., 2N+M in the example shown in FIG. 1), or may be the total number of symbols included in a message reconstructed through the error correction decoding of the data portion (i.e., 2K+J in the example shown in FIG. 1).

If the parameter S represents the total number of symbols included in the data portion, the frame analyzer 101 can calculate the size M of the last code word by following Expression 1 below. As described above, the size of the last code word may be defined by J, in place of M. The frame analyzer 101 can calculate the size J of the last code word by following Expression 2 below. Further, the frame analyzer 101 can calculate the number of code words W by following Expression 3 below.

$$M = \mod(S-1, N) + 1 \quad (1)$$

$$J = \mod(S-1, N) + 1 - 2t \quad (2)$$

$$W = ceil\left(\frac{S}{N}\right) \quad (3)$$

Herein, "mod(A,B)" represents a residual of A when B is modulus, and "ceil(A)" represents a minimum integer number which is not less than A.

On the other hand, if the parameter S represents the total number of symbols included in a message to be reconstructed through the error correction decoding of the data portion, the frame analyzer 101 can calculate the size M of the last code word by following Expression 4 below. As described above, the size of the last code word may be defined by J in place of M. The frame analyzer 101 can calculate the size J of the last code word by following Expression 5 below. Further, the frame analyzer 101 can calculate the number of code words W by following Expression 6 below.

$$M = \mod(S-1, K) + 1 + 2t \quad (4)$$

$$J = \mod(S-1, K) + 1 \quad (5)$$

$$W = ceil\left(\frac{S}{K}\right) \quad (6)$$

N (or K) can be obtained through the analysis of the header portion of the data frame, or the frame analyzer 101 can have already known those values.

The error calculator 102 comprises two operation modes. The two operation modes are called as "initialization mode" and "error detection mode" for convenience. The error calculator 102 in the initialization mode calculates correction coefficients $\beta_i$ (i=1, ..., t) related to the last code word of the data frame which is the target for the process. The error calculator 102 performs the error detection for each code word of the data frame to be processed by, for example, a Chien search and the Forney algorithm. Accordingly, the error calculator 102 can achieve both the calculation of correction coefficients and the error detection for each code word by a shared hardware. The configuration of the hardware of the error calculator 102 and the operation in the initialization mode and the error detection mode will be described later in details.

Figure 3:
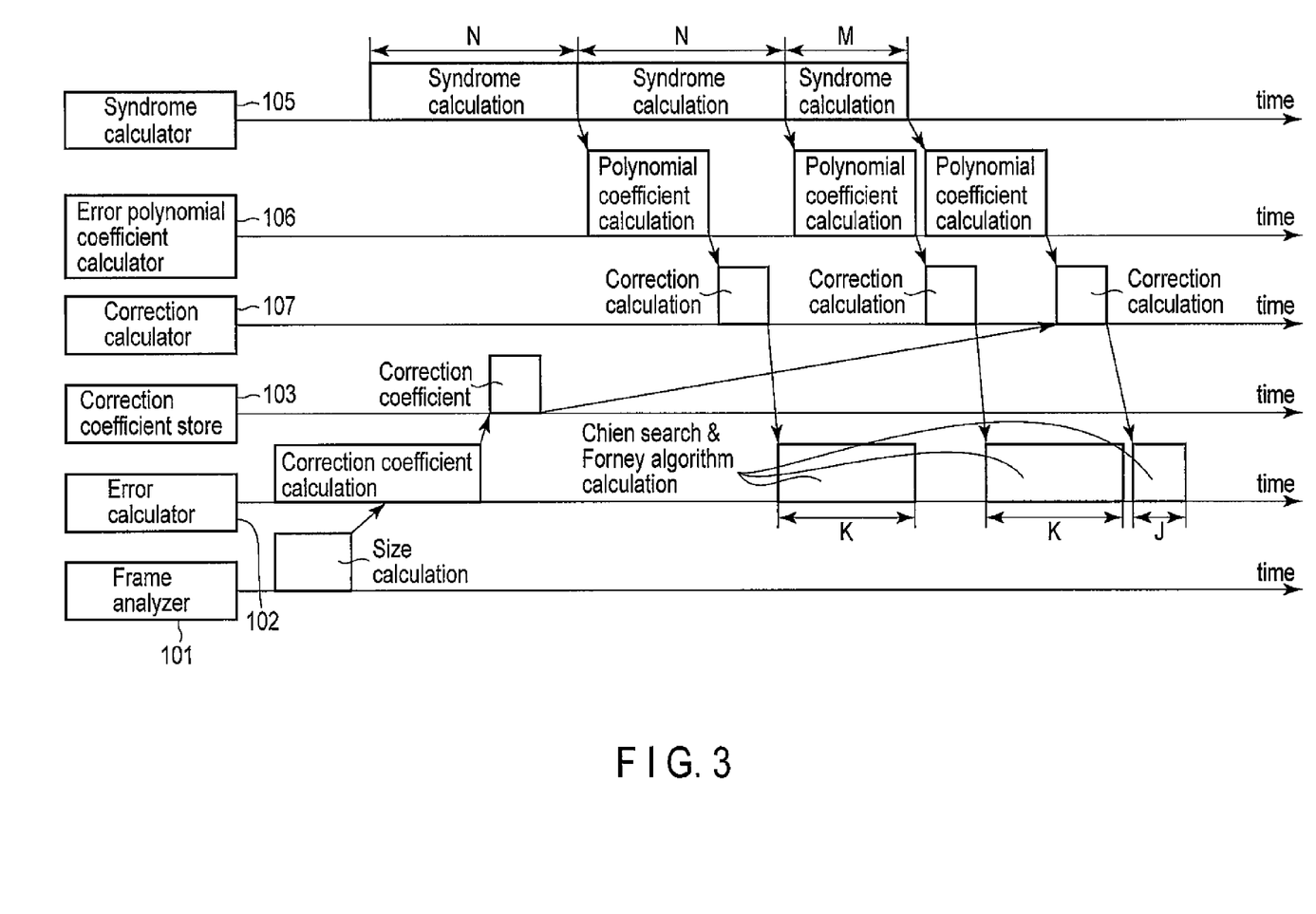
FIG. 3 is a diagram showing an example of the operation of the Reed-Solomon decoder of FIG. 2.

FIG. 3 illustrates the operation timing of each element of the Reed-Solomon decoder of FIG. 2. As will be described later, it is necessary to refer to the size of the last code word when the error calculator 102 is in the initialization mode; thus, the calculation of the size M (or J) of the last code word by the frame analyzer 101 should be completed at least before the error calculator 102 finishes the operation in the initialization mode. However, as shown in FIG. 3, it is possible for the error calculator 102 begins the operation in the initialization mode before the frame analyzer 101 completes the calculation of the size of the last code word for the reason such that the error calculator 102 needs to calculate an intermediate values (which will be described later).

As will be described later, correction coefficients will be necessary for the correction calculation for the last code word at the correction calculator 107. Accordingly, the error calculator 102 should complete the operation in the initialization mode before the error calculator 107 begins the correction calculation for the last code word. For example, as shown in FIG. 3, the error calculator 102 completes the operation in the initialization mode before it begins the operation in the error detection mode for a first code word being arranged at the beginning of the data portion. At least, the initialization mode is finished before the error detection mode begins for a code word which is arranged at immediately before the last code word in the data portion. If such a condition is satisfied, the calculation of correction coefficients does not require the decoding latency to be incremented.

It should be noted that there may be a case where the error calculator 102 does not finish the initialization mode at the point when the error detection mode for the first code word can be started, because of various reasons, such as conditions for implementation and the last code word size. In such a case, the error calculator 102 can put the error detection mode for the first code word on stand-by until it finishes the operation in the initialization mode. Or, the error calculator 102 may calculate residuals in the initialization mode during the period of time between the time when the error detection for a given code word is finished and the time when the error detection mode for a next code word begins. According to the intermittent manner of the operation, increased decoding latency due to stand-by operation can be avoided or inhibited.

The error calculator 102 has the correction coefficient store 103 that stores the correction coefficients calculated in the initialization mode. The correction coefficients are read by the correction calculator 107 for the correction calculation for the last code word.

The syndrome calculator 105 inputs the data portion of the data frame, and calculates syndromes $\sigma_i$ (i=0, . . . , 2t−1) for each code word included in the data portion. The syndrome calculator 105 outputs the calculated syndromes $\sigma_i$ (i=0, . . . , 2t−1) to the error polynomial coefficient calculator 106.

The syndrome $\sigma_i$ is calculated by substituting a root $\alpha_i$ (i=0, . . . , 2t−1) of a generating polynomial G(x) into the polynomial R(x) expressing a code word which is the target of the process. In other words, the syndrome calculator 105 calculates $\sigma_i$ by following Expression 7 below. The generating polynomial G(x) can be expressed as Expression 8.

$$\sigma_i = R(\alpha^i) \quad (7)$$

$$G(x) = (x-\alpha^0)(x-\alpha^1)(x-\alpha^2)\ldots(x-\alpha^{2t-1}) \quad (8)$$

If no error is included in the code word, all the syndromes becomes zero. On the other hand, if an error is included in the code word, more than one syndrome becomes non-zero value which depends only on error patterns (an error location and error value). In other words, the syndrome $\sigma_i$ does not depend on pre-encoded data (message).

The error polynomial coefficient calculator 106 inputs the syndromes from the syndrome calculator 105. The error polynomial coefficient calculator 106 calculates coefficients $\lambda_i$ (i=0, 1, 2, . . . , t) of an error locator polynomial $\Lambda(x)$ and coefficients $\omega_i$ (i=0, 1, 2, . . . , t−1) of an error value polynomial $\Omega(x)$ based on input syndromes. The error polynomial coefficient calculator 106 can calculate coefficients $\lambda_i$ and $\omega_i$ using publicly-known calculation procedures, such as Berlekamp-Massey algorithm and Euclid's algorithm. The error polynomial coefficient calculator 106 outputs the calculated coefficients $\lambda_i$ and $\omega_i$ to the correction calculator 107.

The error calculator 107 inputs coefficients $\lambda_i$ and $\omega_i$ from the error polynomial coefficient calculator 106. The error calculator 107 multiplies the input coefficients $\lambda_i$ and $\omega_i$ with a correction coefficient to obtain the corrected coefficients $\lambda_i'$ and $\omega_i'$. The error calculator 107 outputs the calculated corrected coefficient $\lambda_i'$ and $\omega_i'$ to the error calculator 102.

The error calculation is carried out to achieve rapid error detection of shortened codes. More specifically, since zero symbols are padded at the beginning of the shortened code, a correction coefficient in accordance with the size of a code word is multiplied with coefficients $\lambda_i$ and $\omega_i$ to begin the error detection from the first symbol of the shortened code with the zero symbols being ignored.

As described above, all the code words except for the last code word has a fixed size (N symbols). Accordingly, correction coefficients related to all the code words except for the last code word are also fixed value. Accordingly, by calculating correction coefficients $\gamma_i$ (i=0, 1, 2, . . . , t) for all the code words except for the last code word and storing in a store (not shown), the calculation of the correction coefficients for all the code words except for the last code word can be omitted during the process of decoding. Also, as described above, correction coefficients $\beta_i$ (i=1, . . . , t) for the last code word are calculated by the operation in the initialization mode of the error calculator 102, and the calculated correction coefficients are stored in the correction coefficient store 103. Correction coefficient $\beta_0 = 1$.

The correction calculator 107 corrects coefficients $\lambda_i$ and $\omega_i$ by following Expression 9 below for all the code words except for the last code word. The correction calculator 107 corrects coefficients $\lambda_i$ and $\omega_i$ by following Expression 10 below for the last code word.

$$\lambda_i' = \lambda_i \times \gamma_i$$

$$\omega_i' = \omega_i \times \gamma_i \quad (9)$$

$$\lambda_i' = \lambda_i \times \beta_i$$

$$\omega_i' = \omega_i \times \beta_i \quad (10)$$

Correction coefficient $\gamma_i$ by following Expression 11 below.

$$\gamma_i = \alpha^{-iN} = \alpha^{i(2^q - N)} \quad (11)$$

The correction calculator 107 may set correction coefficients $\gamma_i$ (i=1, . . . , t) at the fixed value, 1 (in other words, the correction calculation for all the code words except for the last code word can be omitted). If the correction calculation is omitted, the error detection begins from the first zero symbol padded at the front, not from the first symbol of the shortened code. Accordingly, if N is close to $2^q$, increase in the decoding latency because of the omission of the correction calculation will be limitative.

Figure 4:
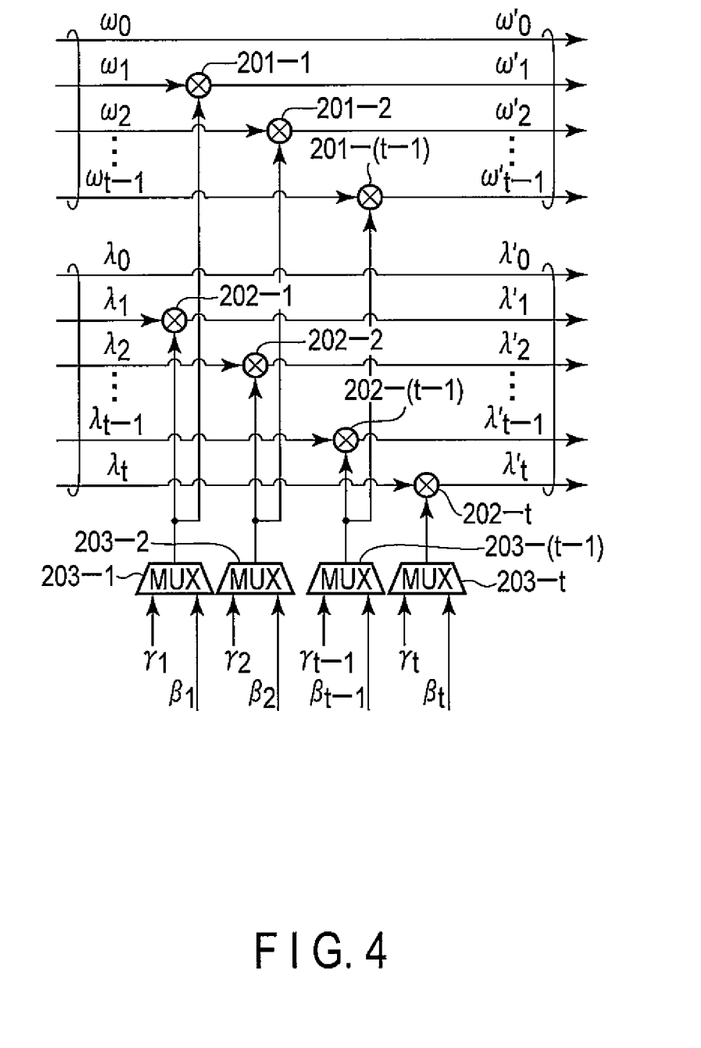
FIG. 4 is a diagram showing the correction calculator of FIG. 2.

The correction calculator 107, as shown in FIG. 4, can be implemented to comprise (2t−1) Galois field multipliers 201-1, . . . , 201-(t−1), 202-1, . . . , 202-t, and t multiplexers 203-1, . . . , 203-t. More specifically, Galois field multiplier 201-i performs correction calculation of coefficient $\omega_i$. Galois field multiplier 202-i performs correction calculation of coefficient $\lambda_i$. The multiplexer 203-i (i=1, . . . , t) selects either one of correction coefficient $\beta_i$ or $\gamma_i$ in accordance with whether a code word to be processed is the last code word or not, and supplies the selected correction coefficient to Galois field multiplier 201-i and Galois field multiplier 202-i. However, coefficient $\omega_t$ does not exist. Thus, the multiplexer 203-t selects either one of correction coefficient $\beta_t$ or $\gamma_t$ in accordance with whether a code word to be processed is the last code word or not, and supplies the selected coefficient to Galois multiplier 202-t.

Figure 5:
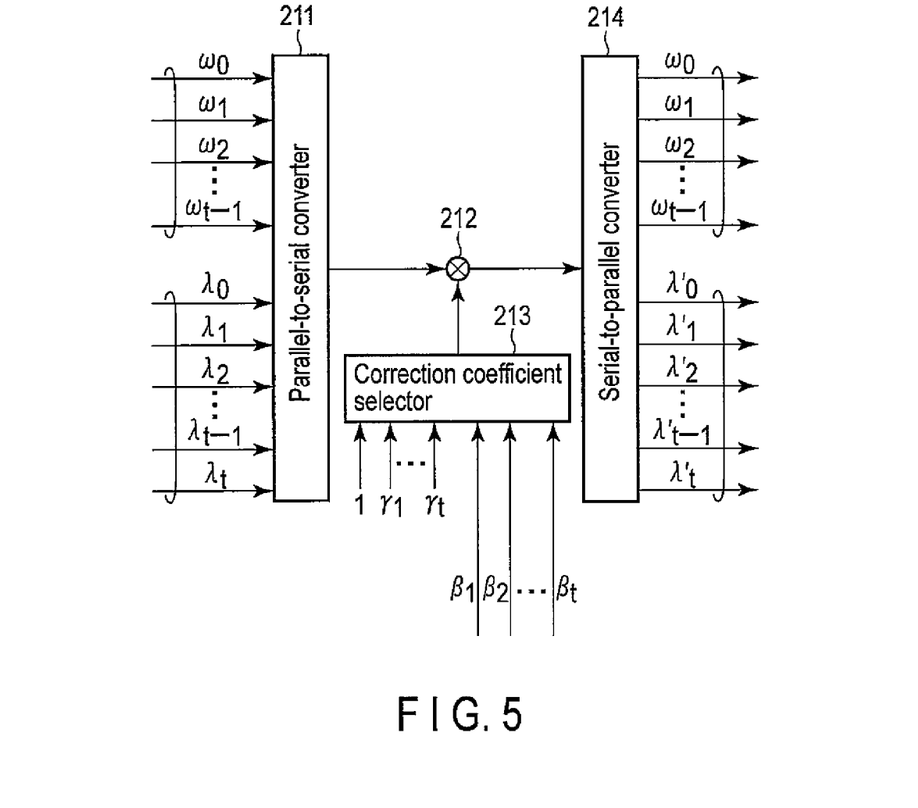
FIG. 5 is a diagram showing the correction calculator of FIG. 2.

The correction calculator 107, as shown in FIG. 5, can be implemented to comprise a parallel-to-serial converter 211, one Galois field multiplier 212, a correction coefficient selector 213, and a serial-to-parallel converter 214. The parallel-to-serial converter 211 performs parallel-to-serial conversion on coefficients $\omega_i$ and $\lambda_i$, and supplies a sequence of coefficients to the Galois field multiplier 212. The correction coefficients selector 213 sequentially selects a correction coefficients among 1 ($=\gamma_0=\beta_0$), $\gamma_1$, . . . , $\gamma_t$, $\beta_1$, . . . $\beta_t$, so that the selected correction coefficients correspond to the sequence of coefficients, and supplies to a sequence of correction coefficients the Galois field multiplier 212. The Galois field multiplier 212 performs correction calculation by multiplying successively the sequence of coefficients from the parallel-to-serial converter 211 with the sequence of correction coefficients from the correction coefficients selector 213. The Galois field multiplier 212 supplies sequence of corrected coefficients to the serial-to-parallel converter 214. The serial-to-parallel converter 214 performs serial-to-parallel conversion on the sequence of corrected coefficients from the Galois field multiplier 212 to output corrected coefficients $\omega_i'$ and $\lambda_i'$.

Further, by combining FIG. 4 and FIG. 5, the correction calculator 107 can be implemented to comprise 2 to (2t−2) Galois field multipliers. Thus, the correction calculator 107 can be implemented to comprise from 1 to (2t−1) Galois field multipliers. Since the minimum number of Galois field multipliers required to implement the correction calculator 107 is 1, the correction calculator 107 may be implemented such that it shares some or all of the Galois field multipliers included in the error polynomial coefficient calculator 106.

The error calculator 102 in the error detection mode inputs corrected coefficients $\omega_i'$ and $\lambda_i'$ from the correction calculator 107. The error calculator 102 calculates an error location by the Chien search, and calculates an error value by the Forney algorithm. The error calculator 102 detects an error value. The error calculator 102 outputs the detected error value to the Galois field adder 108.

Specifically, the Chien search is a procedure for determining whether an error exists in the N-$i^{th}$ symbol (M-$i^{th}$ for the last code word) based on whether $\Lambda(\alpha^i)$ is zero or not. The Forney algorithm is a procedure for determining an error value based on a value of $\Omega(\alpha^i)/\Lambda^{(odd)}(\alpha^i)$. $\Lambda^{(odd)}(x)$ is a partial polynomial consisting only of terms at odd-numbered order in the error locator polynomial $\Lambda(x)$.

Figure 6:
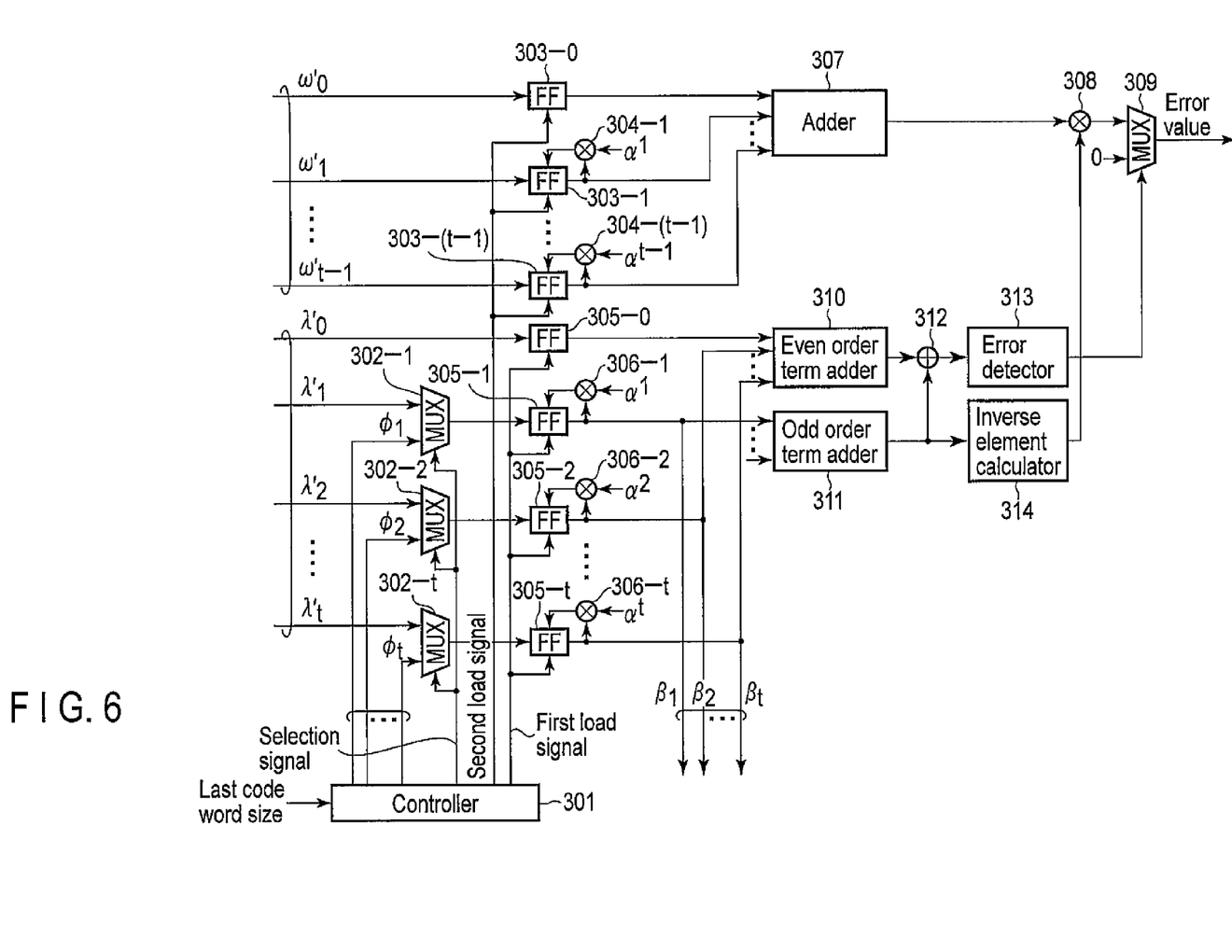
FIG. 6 is a diagram showing the error calculator of FIG. 2.

As illustrated in FIG. 6, the error calculator 102 can be implemented to comprise a controller 301, t multiplexers 302-1, ... 302-t, (2t+1) flip-flops 303-0, ... 303-(t−1), 305-0, ... , 305-t, (2t−1) Galois field multipliers 304-1, ... , 304-(t−1), 306-1, ... , 306-t, an adder 307, a Galois field multiplier 308, a multiplexer 309, an even order term adder 310, an odd order term adder 311, a Galois field adder 312, an error detector 313, an inverse element calculator 314.

In the initialization mode, the controller 301 supplies initial values $\phi_1, \ldots \phi_t$ to first input terminals of the multiplexers 302-1, ... 302-t, and supplies a selection signal to the multiplexers 302-1, ... 302-t to have them select first input terminals. Initial value $\phi_i$ can be expressed by Expression 12 below. In Expression 12, P is a parameter to determine an initial value.

$$\phi_i = \alpha^{iP} \qquad (12)$$

In the error detection mode, the controller 301 supplies a selection signal to the multiplexers 302-1, ... 302-t to have them select second input terminals in the error detection mode. The controller 301 supplies a first load signal to flip-flops 305-0, ... , 305-t, and supplies a second load signal to flip-flops 303-0, ... , 303-(t−1).

The multiplexers 302-1, ... , 302-t input initial values $\phi_1, \ldots, \phi_t$ from the controller 301 at the first input terminals, and input corrected coefficients $\lambda_1', \ldots, \lambda_t'$ from the coefficient calculator 107 at the second input terminal. In the initialization mode, the multiplexers 302-1, ... , 302-t select the first input terminals in accordance with the selection signal from the controller 301, and output initial values $\phi_1, \ldots, \phi_t$. In the error detection mode, the multiplexers 302-1, ... , 302-t select the second input terminals in accordance with the selection signal from the controller 301, and output initial values $\lambda_1', \ldots, \lambda_t'$.

In the error detection mode, flip-flop 303-0 supplies corrected coefficient $\omega_0'$ from the correction calculator 107 to the adder 307. In the error detection mode, flip-flops 303-1, ... , 303-(t−1) and Galois field multipliers 304-1, ... , 304-(t−1) multiply corrected coefficients $\omega_1', \ldots, \omega_{t-1}'$ from the correction calculator 107 with the multiplication factors $\alpha^1, \ldots, \alpha^{t-1}$, and supplies the result of the multiplication to the adder 307.

In the error detection mode, flip-flop 305-0 supplies corrected coefficient $\lambda_0'$ from the correction calculator 107 to the even order term adder 310. In the error detection mode, flip-flops 305-1, ... , 305-t and Galois field multipliers 306-1, ... , 306-t multiply corrected coefficients $\lambda_1', \ldots, \lambda_t'$ from the correction calculator 107 with the multiplication factors $\alpha^1, \ldots, \alpha^t$, and supply the result of the multiplication to either the even order term adder 310 or the odd order term adder 311.

In the initialization mode, flip-flops 305-1, ... , 305-t and Galois field multipliers 306-1, ... , 306-t repeat multiplication of initial values $\phi_1, \ldots, \phi_t$ with multiplication factors $\alpha^1, \ldots, \alpha^t$ only for mod(P−M, $2^q$) cycles to calculate correction coefficients $\beta_1, \ldots, \beta_t$. In other words, correction coefficient $\beta_i$ is expressed as $\beta_i = \alpha^{-iM}$ (i=1, ... , t). Flip-flops 305-1, ... , 305-t supply the calculated correction coefficients $\beta_1, \ldots, \beta_t$ to the correction coefficient store 103.

In the error detection mode, the adder 307 inputs signals from flip-flops 303-0, ... , 303-(t−1), and adds the signals to form an error value polynomial. In the error detection mode, the even order term adder 310 inputs signals from flip-flops 305-0, ... , 305-t corresponding to even order term in the error locator polynomial, and sums the input signals. In the error detection mode, the odd order term adder 310 inputs signals from flip-flops 305-1, ... , 305-t corresponding to odd order term in the error locator polynomial, and sums the input signals.

The Galois field adder 312 adds signals from the even order term adder 310 and the odd order term adder 311 to calculate an error locator polynomial. The error detector 313 inputs the error locator polynomial from the Galois field adder 312 to carry out error detection. The inverse element calculator 314 inputs the odd order terms of the error locator polynomial from the odd order term adder 311 to calculate the inverse element thereof. The inverse element calculator 314 supplies the calculated inverse element of the odd order terms of the error locator polynomial to the Galois field multiplier 308. The Galois field multiplier 308 multiplies the error value polynomial from the adder 307 with the inverse element of the order terms of the error locator polynomial from the inverse element calculator 314, and supplies the result of the multiplication (i.e., $\Omega(\alpha^i)/\Lambda^{(odd)}(\alpha^i)$) to the first input terminal of the multiplexer 309. The multiplexer 309 inputs zero at the second input terminal. The multiplexer 309 selects either zero or a signal from the Galois field multiplier 308 in accordance with the result of error detection from the error detector 313, and outputs it as an error value.

According to the error calculator 102 of FIG. 6, the calculation of correction coefficients regarding the last code word is realized by sharing flip-flops 305-1, ... , 305-t and Galois field multipliers 306-1, ... , 306-t for a Chien search.

Figure 7:
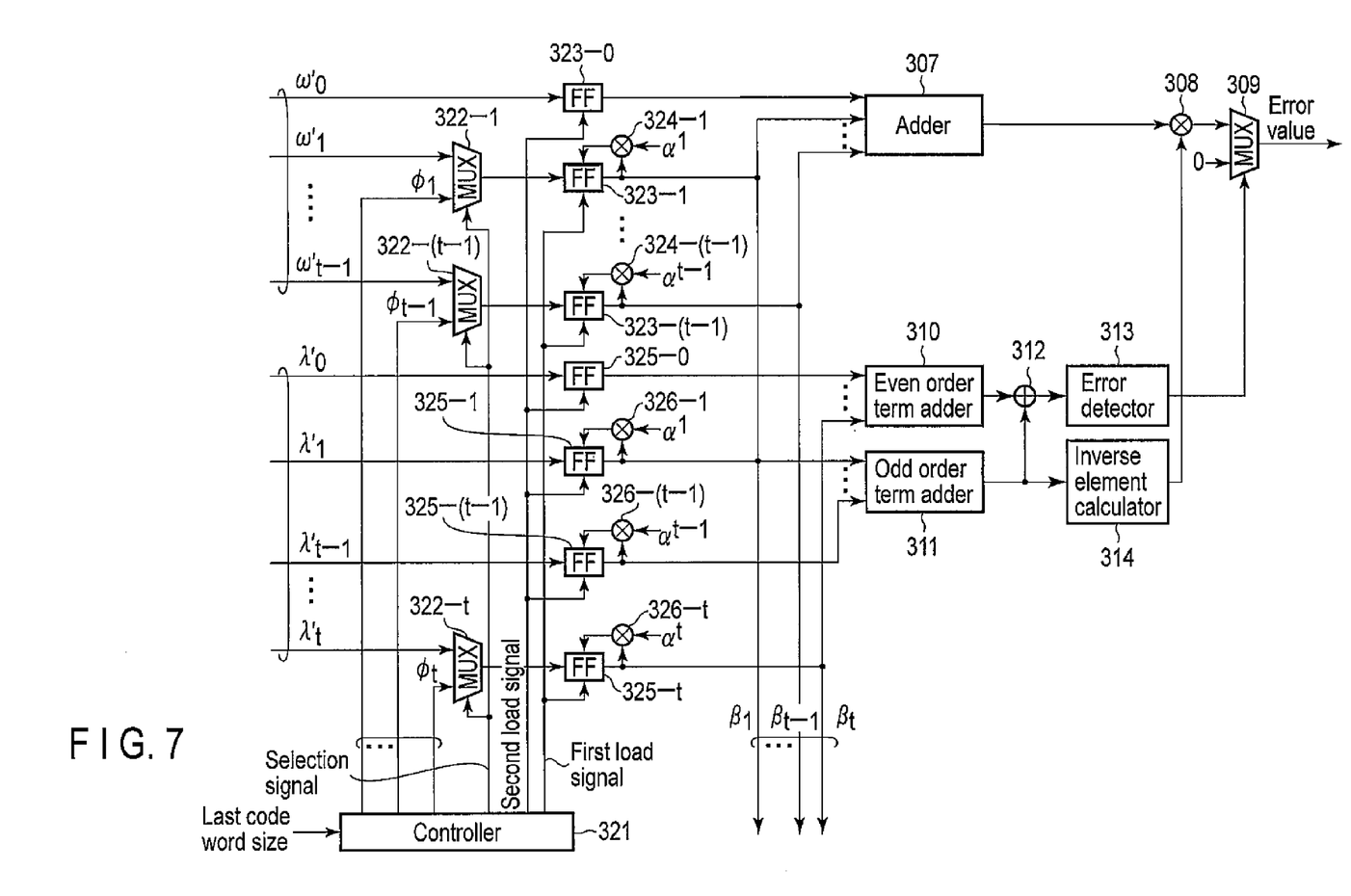
FIG. 7 is a diagram showing the error calculator of FIG. 2.

As shown in FIG. 7, the error calculator 102 can be implemented to complies a controller 321, t multiplexers 322-1, ... , 322-t, (2t+1) flip-flops 323-0, ... , 323-(t−1), 325-0, ... , 325-t, (2t−1) Galois field multipliers 324-1, ... , 324-(t−1), 326-1, ... , 326-t, the adder 307, the Galois field multiplier 308, the multiplexer 309, the even order term adder 310, the odd order term adder 311, the Galois field adder 312, the error detector 313, and the inverse element calculator 314.

In the error detection mode, the operation of flip-flops 323-0, ... , 323-(t−1), 325-0, ... , 325-t, (2t−1) Galois field multipliers 324-1, ... , 324-(t−1), 326-1, ... , 326-t, are the same as the operation of flip-flops 303-0, ... , 303-(t−1), 305-0, ... , 305-t and Galois field multipliers 304-1, ... , 304-(t−1), 306-1, ... , 306-t.

In the initialization mode, the controller 321 supplies initial values $\phi_1, \ldots, \phi_t$, to the first input terminals of the multiplexers 322-1, ... , 322-t, and supplies a selection signal to the multiplexers 322-1, ... , 322-t to have them select the first input terminals. In the error detection mode, the controller 321 supplies a selection signal to the multiplexers 322-1, ... , 322-t to have them select the second input terminals. The controller 321 supplies a first load signal to flip-flops 325-0, ... , 325-t, and supplies a second load signal to flip-flops 326-0, ... , 326-(t−1).

The multiplexers 322-1, ... , 322-(t−1) input initial values $\phi_1, \ldots, \phi_{t-1}$ from the controller 321 at the first input terminals, and input corrected coefficients $\phi_1', \ldots, \phi_{t-1}'$ from the correction calculator 107 at the second input terminals. In the initialization mode, the multiplexers 322-1, ..., 322-(t−1) select the first input terminals in accordance with the selection signal from the controller 321, and output initial values $\phi_1, \ldots, \phi_{t-1}$. In the error detection mode, the multiplexers 322-1, ..., 322-(t−1) select the second input terminals in accordance with the selection signal from the controller 321, and output corrected coefficients $\phi_1', \ldots, \phi_{t-1}'$.

The multiplexer 322-t inputs initial value $\phi_t$ from the controller 321 at the first input terminal, and inputs corrected coefficient $\lambda_t'$ from the correction calculator 107 at the second input terminal. In the initialization mode, the multiplexer 322-t selects the first input terminal in accordance with the selection signal from the controller 321 and outputs the initial value $\phi_t$. In the error detection mode, the multiplexer 322-t selects the second input terminal in accordance with the selection signal from the controller 321 and outputs the corrected coefficient $\lambda_t'$.

In the initialization mode, flip-flops 323-1, ..., 323-(t−1) and Galois field multipliers 324-1, ..., 324-(t−1) repeat multiplication of initial values $\phi_1, \ldots, \phi_{t-1}$ with multiplication factors $\alpha^1, \ldots, \alpha^{t-1}$ only for mod(P−M, $2^q$) cycles to calculate correction coefficients $\beta_1, \ldots, \beta_{t-1}$. Flip-flops 323-1, ..., 323-(t−1) supplies calculated correction coefficients $\beta_1, \ldots, \beta_{t-1}$ to the correction coefficient store 103. Flip flops 325-t and Galois field multiplier 326-t repeats multiplication of the initial value $\phi_t$ from the multiplexer 322-t with multiplication factor at only for mod(P−M, $2^q$) cycles to calculate correction coefficient $\beta_t$. Flip-flop 325-t supplies the calculated correction coefficient $\beta_t$ to the correction coefficient store 103.

According to the error calculator 102 of FIG. 7, the calculation of correction coefficients regarding the last code word is realized by sharing flip-flops 323-1, ... 323-(t−1) and Galois field multipliers 324-1, ... 324-(t−1) for the Forney algorithm and flip-flop 325-t and Galois field multiplier 326-t for the Chien search.

According to the examples of FIGS. 6 and 7, the error calculator 102 shares all the hardware structures for the initialization mode with the hardware structures for the error detection mode. However, the error calculator 102 may share some of the hardware structure for the initialization mode with the error detection mode, and the other hardware structure for the initialization mode may be independently provided.

As described above, the calculation of correction coefficients in the initialization mode requires mod(P−M, $2^q$) cycles. For example, if P=0 (i.e., $\phi_i=1$) and the last code word size M=1, $2^q-1$ cycles are necessary to calculate correction coefficient $\beta_i$. In the following, a method for avoiding or inhibiting increased decoding latency due to the calculation of correction coefficient $\beta_i$ will be described.

By giving multiple different values to parameter P, multiple different initial values $\phi_i (=\alpha^{-iP})$ can be prepared. As the error calculator 102 selects the different initial values to use in accordance with the size of the last code word, the number of cycles required to calculate the correction coefficient $\beta_i$ can be reduced. For example, the error calculator 102 prepares the first and second initial values by setting parameter P at 0 and $2^{q-1}$. Then, the error calculator 102 uses the second initial value when the last code word size M is not greater than a threshold $2^{q-1}$, and uses the first initial value when the last code word size M is greater than a threshold $2^{q-1}$. According to such operation, the number of cycles required to calculate the correction coefficient $\beta_i$ can be reduced to $2^{q-1}$ at maximum.

The error calculator 102 may calculate an intermediate value of correction coefficient $\beta_i$ in advance, by starting the calculation of the correction coefficient $\beta_i$ prior to the calculation of the last code word size M is finished at the frame analyzer 101. For example, suppose if the error calculator 102 completes the calculation for $2^{q-1}$ cycle where initial value $\phi_i=1$ (i.e., P=0) before the last code word size M is calculated. If the last code word size M is not greater than a threshold $2^{q-1}$, the error calculator 102 continues to calculate correction coefficient $\beta_i$ using an intermediate value, and if the last code word size M is greater than a threshold $2^{q-1}$, the error calculator 102 starts again calculating correction coefficient $\beta_i$ from initial value $\phi_i=1$. According to such operation, the number of cycles required since the calculation of the final code word size M finishes until the calculation of correction coefficient $\beta_i$ can be reduced to $2^{q-1}$ at maximum.

The Galois field adder 108 inputs a code word to be processed from the data store 104 and an error value from the error calculator 102. The Galois field adder 108 corrects errors by summing (in other words, carrying out exclusive OR of) the code word to be processed and the error value, and obtains output data.

As explained above, the Reed-Solomon decoder according to the first embodiment finishes calculation of error coefficients for the last code word before staring error correction on a code word immediately before the last code word. Accordingly, according to the Reed-Solomon decoder can avoid (or, inhibit) increased decoding latency due to calculation of correction coefficients for the last code word. Also, the Reed-Solomon decoder carries out the calculation of correction coefficients for the last code word and the error detection on each code word, using the hardware of the error calculator in a time division manner. Thus, the Reed-Solomon decoder does not require hardware dedicated for the correction calculation for the last code word, thereby avoiding increase of circuitry size and power consumption.

Figure 8:
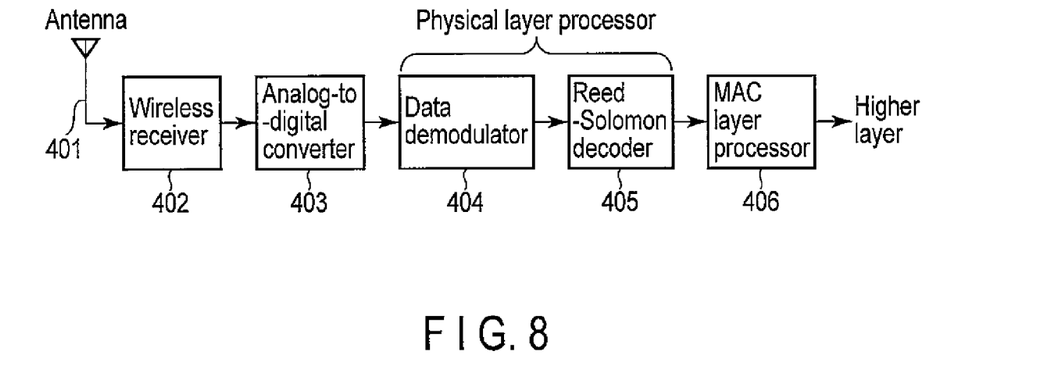
FIG. 8 is a block diagram showing the reception apparatus including the Reed-Solomon decoder according to the first embodiment.

The Reed-Solomon decoder according to the first embodiment can be implemented to a reception apparatus, for example. As illustrated in FIG. 8, a reception apparatus includes a wireless receiver 402, an analog-to-digital converter 403, a data demodulator 404, a Reed-Solomon decoder 405, and Media Access Control (MAC) layer processor 406. The reception apparatus in FIG. 8 receives radio signals through an antenna 401.

The wireless receiver 402 converts the radio signals received by the antenna 401 into baseband analog signals. The analog-to-digital converter 403 converts the baseband analog signals into digital signals. The data demodulator 404 performs equalization processing, frequency offset processing, etc. (in other words, distortion correction processing of a channel and an analog circuitry) on the digital signals from the analog-to-digital converter 403, and reconstructs modulated signal constellation, such as binary phase-shift keying (BPSK) and quadrature phase-shift keying (QPSK) to estimate a bit value corresponding to the reconstructed modulated signal constellation.

As the Reed-Solomon decoder 405, the Reed-Solomon decoder according to the first embodiment is implemented. The Reed-Solomon decoder 405 performs the aforementioned error correction decoding for the bit values (corresponding to the aforementioned data frame) from the data demodulator 404 to obtain received data in which errors have been corrected. The Reed-Solomon decoder 405 supplies the error-corrected received data to, for example, the MAC layer processor 406. The MAC layer processor 406 inputs the error-corrected received data from the Reed-Solomon decoder 405 to perform a given MAC processing, and supplies the result of the MAC processing to a higher layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A Reed-Solomon decoder comprising:
an analyzer to analyze a data frame including a data portion including at least two Reed-Solomon code words and a header portion including information indicating a size of the data portion and to calculate a size of a last code word located at an end of the data portion, using the information included in the header portion; and
an error calculator configured to include at least one multiplier, the error calculator being operable as:
a coefficient calculator to calculate correction coefficients, using the size of the last code word, for correcting coefficients of an error locator polynomial and coefficients of an error value polynomial for the last code word in accordance with a difference between a base size of the Reed-Solomon code words and the size of the last code word, before error detection for a code word located immediately before the last code word in the data portion begins; and
an error detector to perform error location calculation with a Chien search and to perform error value calculation with a Forney algorithm;
wherein the at least one multiplier is commonly shared by both of the coefficient calculator and the error detector in a time division manner.

2. The decoder according to claim 1, wherein the coefficient calculator calculates the correction coefficients before error detection on a code word located at a beginning of the data portion begins.

3. The decoder according to claim 1, wherein the coefficient calculator calculates the correction coefficients by repeating multiplication of initial values with multiplication factors a first number of times in accordance with the size of the last code word.

4. The decoder according to claim 1, wherein the coefficient calculator selects one set of initial values from a plurality of sets of initial values based on the size of the last code word, and repeats multiplication of selected initial values with multiplication factors a number of times in accordance with the size of the last code word to calculate the correction coefficients.

5. A reception apparatus, comprising:
the decoder according to claim 1; and
a wireless receiver configured to receive the data frame.

6. A Reed-Solomon decoder comprising:
an analyzer to analyze a data frame including a data portion including at least two Reed-Solomon code words and a header portion including information indicating a size of the data portion and to calculate a size of a last code word located at an end of the data portion, using the information included in the header portion; and
a coefficient calculator to calculate correction coefficients, using the size of the last code word, for correcting coefficients of an error locator polynomial and coefficients of an error value polynomial for the last code word in accordance with a difference between a base size of the Reed-Solomon code words and the size of the last code word, before error detection for a code word located immediately before the last code word in the data portion begins;
wherein the coefficient calculator calculates the correction coefficients by repeating multiplication of initial values with multiplication factors a first number of times in accordance with the size of the last code word;
wherein the coefficient calculator calculates intermediate values by repeating multiplication of the initial values with the multiplication factors a second number of times before the analyzer finishes calculating the size of the last code word; and
after the analyzer finishes the calculation of the size of the last code word, (A) if the size of the last code word is not greater than a threshold corresponding to the second number of times, the coefficient calculator calculates the correction coefficients by repeating multiplication of the intermediate values with the multiplication factors a number of times equal to a difference between the first number of times and the second number of times, and (B) if the size of the last code word exceeds the threshold, the coefficient calculator calculates the correction coefficients by repeating multiplication of the initial values with the multiplication factors the first number of times.

7. A Reed-Solomon decoder comprising:
an analyzer to analyze a data frame including a data portion including at least two Reed-Solomon code words and a header portion including information indicating a size of the data portion and to calculate a size of a last code word located at an end of the data portion, using the information included in the header portion; and
a coefficient calculator to calculate correction coefficients, using the size of the last code word, for correcting coefficients of an error locator polynomial and coefficients of an error value polynomial for the last code word in accordance with a difference between a base size of the Reed-Solomon code words and the size of the last code word, before error detection for a code word located immediately before the last code word in the data portion begins;
wherein the coefficient calculator, if the size of the last code word exceeds a threshold, repeats multiplication of first initial values with a multiplication factors a first number of times in accordance with the size of the last code word to calculate the correction coefficients, and if the size of the last code word is not greater than the threshold, the calculator repeats multiplication of second initial values with the multiplication factors a second number of times in accordance with the size of the last code word to calculate the correction coefficients.

* * * * *